(12) United States Patent
Fant (10) Patent No.: US 7,478,222 B2
(45) Date of Patent: Jan. 13, 2009

(54) PROGRAMMABLE PIPELINE ARRAY

(75) Inventor: Karl M. Fant, 2525 Fairbrook Dr., Mountain View, CA (US) 94040

(73) Assignee: Karl M. Fant, Mountain View, CA (US)

( * ) Notice: Subject to any disclaimer, the term of this patent is extended or adjusted under 35 U.S.C. 154(b) by 0 days.

(21) Appl. No.: 11/390,181

(22) Filed: Mar. 28, 2006

(65) Prior Publication Data

US 2006/0233006 A1    Oct. 19, 2006

Related U.S. Application Data

(60) Provisional application No. 60/665,827, filed on Mar. 29, 2005.

(51) Int. Cl.
*G06F 15/80* (2006.01)
(52) U.S. Cl. ........................................... 712/10
(58) Field of Classification Search ................... 712/10, 712/19, 15, 18, 8
See application file for complete search history.

(56) References Cited

U.S. PATENT DOCUMENTS

| | | | | |
|---|---|---|---|---|
| 4,509,187 A | * | 4/1985 | Ackland et al. | 704/241 |
| 4,884,193 A | * | 11/1989 | Lang | 712/18 |
| 4,922,418 A | * | 5/1990 | Dolecek | 714/51 |
| 5,031,139 A | * | 7/1991 | Sinclair | 712/18 |
| 5,203,005 A | * | 4/1993 | Horst | 712/15 |
| 5,379,036 A | * | 1/1995 | Storer | 341/51 |
| 5,410,723 A | * | 4/1995 | Schmidt et al. | 712/18 |
| 5,541,660 A | * | 7/1996 | Kim et al. | 375/240.16 |
| 5,600,843 A | * | 2/1997 | Kato et al. | 712/19 |
| 6,150,839 A | * | 11/2000 | New et al. | 326/40 |
| 6,339,819 B1 | * | 1/2002 | Huppenthal et al. | 712/16 |
| 6,405,185 B1 | * | 6/2002 | Pechanek et al. | 706/41 |
| 7,225,324 B2 | * | 5/2007 | Huppenthal et al. | 712/226 |
| 2004/0205321 A1 | * | 10/2004 | Mirsky et al. | 712/15 |

* cited by examiner

*Primary Examiner*—Eric Coleman
(74) *Attorney, Agent, or Firm*—Steptoe & Johnson LLP (57) ABSTRACT

Disclosed is an array of programmable data-processing cells configured as a plurality of cross-connected pipelines. An apparatus includes cells capable of performing data-processing functions selectable by a presented instruction. A first set of cells includes an input cell, an output cell, and a series of at least one interior cell providing an acyclic data processing path from the input cell to the output cell. Additional cells are similarly configured. Memory presents configuration instructions to cells in response to a configuration code. Data advances through ranks of the cells. The configuration code advances to memory associated with a rank in tandem with the data.

10 Claims, 11 Drawing Sheets

PROGRAMMABLE PIPELINE ARRAY

BACKGROUND OF THE INVENTION

1. Field of the Invention

The invention relates to the field of electronics. More particularly, the invention relates a logically determined system that does not rely on a clock for timing and control of data processing behavior.

2. Related Art

The field of logically determined design as described in:

Karl Fant. *Logically Determined Design: Clockless System Design with NULL Convention Logic.* New York: Wiley, 2005 ("Fant 2005")

Proposals are known for making asynchronous systems as reflected in the documents listed below.

Traver, C., Reese, R. B., Thornton, M. A.: Cell Designs for Self-timed FPGAs. Proc. of the 2001 ASIC/SOC Conf. (2001).

How, D. L.: A Self Clocked FPGA for General Purpose Logic Emulation. Proc. Of the IEEE 1996 Custom Integrated Circuits Conf. (1996).

Ho, Q. T., et al.: Implementing asynchronous circuits on LUT based FPGAs. Proc. 12th Int'l Conf. on Field Programmable Logic and Applications (2002).

Song Peng, David Fang, John Teifel, and Rajit Manohar. Automated Synthesis for Asynchronous FPGAs. 13th ACM International Symposium on Field Programmable Gate Arrays, February 2005.

John Teifel and Rajit Manohar. An Asynchronous Dataflow FPGA Architecture. IEEE Transactions on Computers (special issue), November 2004.

John Teifel and Rajit Manohar. Static Tokens: Using Dataflow to Automate Concurrent Pipeline Synthesis. Proceedings of the 10th International Symposium on Asynchronous Circuits and Systems, April 2004.

John Teifel and Rajit Manohar. Highly Pipelined Asynchronous FPGAs. 12th ACM International Symposium on Field-Programmable Gate Arrays, Monterey, Calif., February 2004.

John Teifel and Rajit Manohar. Programmable Asynchronous Pipeline Arrays. Proceedings of the 13th International Conference on Field Programmable Logic and Applications, pp. 345-354, Lisbon, Portugal, September 2003.

S. Hauck, S. Burns, G. Borriello, C. Ebeling, "An FPGA For Implementing Asynchronous Circuits", IEEE Design & Test of Computers, Vol. 11, No. 3, pp. 60-69, Fall, 1994.

G. Borriello, C. Ebeling, S. Hauck, S. Burns, "The Triptych FPGA Architecture" (PDF), IEEE Transactions on VLSI Systems, Vol. 3, No. 4, pp. 491-501, December, 1995.

Janusz A. Brzozowski, Carl-Johan H. Seger, *Asynchronous Circuits.* New York: Springer-Verlag, 1995.

David L. Dill, *Trace Theory for Automatic Hierarchical Verification of Speed-Independent Circuits,* Cambridge: MIT Press, 1989.

Michael Kishinevsky, Alex Kondratyev, Alexander Taubin, Victor Varshavsky, *Concurrent Hardware, The Theory and Practice of Self-timed Design.* New York, Wiley, 1994.

Alain J. Martin, "Programming in VLSI: From communicating processes to delay-insensitive circuits", In C. A. R. Hoare, editor, Developments in Concurrency and Communication, Addison-Wesley, 1990, pp. 1-64.

Chris J. Meyers, *Asynchronous Circuit Design.* New York, Wiley, 2001.

Jens Sparsø, Steve Furber, eds, *Principles of Asynchronous Circuit Design.* Boston, Kluwer, 2001.

Ivan E. Sutherland, "Micropipelines", Communications of the ACM, Vol. 32, No. 6, June 1989, pp. 720-738.

Steve H. Unger, *Asynchronous Sequential Switching Circuits.* New York, Wiley-Interscience, 1969.

Victor I. Varshavsky, *Self-Timed Control of Concurrent Processes.* Dordrecht, The Netherlands., Kluwer Academic, 1990.

Patents

U.S. Pat. No. 5,367,209, issued Nov. 22, 1994, S. Hauck, G. Borriello, S. Burns, C. Ebeling, "Field Programmable Gate Array for Synchronous and Asynchronous Operation."

U.S. PATENT DOCUMENTS referenced by above

| 4,293,783 | October 1981 | Patil | 307/465 |
| --- | --- | --- | --- |
| 4,918,440 | April 1990 | Furtek | 340/825.83 |
| 4,969,121 | November 1990 | Chan | 307/465 |
| 5,089,973 | February 1992 | Furtek | 364/489 |
| 5,208,491 | May 1993 | Ebeling | 307/465.1 |

SUMMARY OF THE INVENTION

An architecture is disclosed having a characteristic of permitting an array of data processing functions to be dynamically configured for each consecutive input data set presented to the array. A programmable pipeline array (PPA) is (speaking loosely) an array of pipeline segments with configurable functionality and connectivity. Each pipeline segment consists of a pipeline cell (P Cell) which embodies the functionality and a memory which contains the configuration specifications. The input to the PPA is set of data wavefronts and a configuration code presented together. For every Nth data wavefront set there is an Nth configuration code. The data wavefronts flow through the pipeline data paths of the P Cells. The configuration code flows along the pipeline paths to each memory, through the memory and as a configuration directive to each P Cell.

The wavefront flow is coordinated by the completeness behavior of each pipeline stage. At each P Cell in the PPA each Nth data wavefront arriving at a P Cell is associated with the Nth configuration directive arriving at that P Cell. For each Nth set of data wavefronts presented to the PPA, its propagation through the PPA is completely managed by the Nth configuration code presented with the wavefronts at the input of the PPA.

As a presented data wavefront and its configuration code propagate through the first stages of the PPA followed by a NULL wavefront a next set of wavefronts and their configuration code can be presented and begin propagating through the PPA. Multiple sets of data wavefronts will simultaneously propagate through the PPA each set of wavefronts being accompanied by a different configuration code and being processed by a different configuration of the PPA.

DETAILED DESCRIPTION

1. Conventions

The embodiments described below preferably are logically determined electronic systems, in the sense that they do not require a system clock to synchronize logic operation. They are based on non-Boolean logic primitives and utilize data representations that are not limited to having first and second data states. (Of course, asynchronous logic may be configured to perform Boolean logic, as well as other more complex functions.) Certain conventions will be used herein to describe the preferred embodiments. Some of those conventions are discussed preliminarily in order to assist in understanding the descriptions that follow.

The embodiments described below preferably use one of the data representations discussed in U.S. Pat. No. 5,305,463, "Null Convention Logic System," which is incorporated herein by reference in its entirety. In one such representation, a variable has a number of possible values. Each value is assigned to a single physical signal line within a defined set of signal lines. Each signal line may assume a meaningful data state or another state which has no data meaning (i.e., the NULL state). Only one signal line of a set may be in the meaningful state at a time. The value of the variable is determined by noting which of the signal lines is in the meaningful state. If all signal lines are in the NULL state, the variable has no data value. For example, in a so-called "dual rail" representation, a single binary digit is represented using two physical signal lines. The first signal line is assigned the numeric value zero (0), and a second signal line is assigned the numeric value "1." Each signal line may assume one of two voltage states, e.g., zero (0) volts or five (5) volts. (These voltage values are for illustrative purposes. Other voltages, and non-voltage representations, such as current, may be used.) When the first signal line assumes the five-volt state and the second signal line assumes the zero-volt state, the variable takes on the numeric value "0." When the second signal line assumes the five-volt state and the first signal line assumes the zero-volt state, the variable takes on the numeric value "1." When both signal lines are in the zero-volt state, the variable has no data meaning. During normal operation, it is not permitted for both signal lines to be in the five-volt state. A variety of other data representations can be used, e.g., inverted logic. For the purpose of illustration, dual rail representation of binary signals will be assumed in the remainder of this description, with signal lines able to assume first and second voltage states. This choice of data representation is exemplary, and other data representation may be used.

Hereafter, a signal line will be said to be "asserted" or "meaningful" if it is in a meaningful data state. A signal line will be said to be NULL if it is in the NULL state. A variable will be said to be asserted or meaningful if any of its associated signal lines is in a meaningful data state. A variable will be said to be NULL if all of its associated signal lines are in a NULL state.

The embodiments described below preferably use threshold logic implemented with gates described in U.S. patent application Ser. No. 08/711,232, "Null Convention Threshold Gate," filed Sep. 9, 1996, now U.S. Pat. No. 5,656,948, which is incorporated herein by reference in its entirety. In one such family of gates, each gate has a single output and a number of inputs. A gate receives inputs that can be asserted or NULL, and the gate drives an output physical line to its asserted or NULL state according to switching rules. This choice of logic gates is exemplary, and other logic gates may be used.

Figures 1, 2A, 2B, 3A:
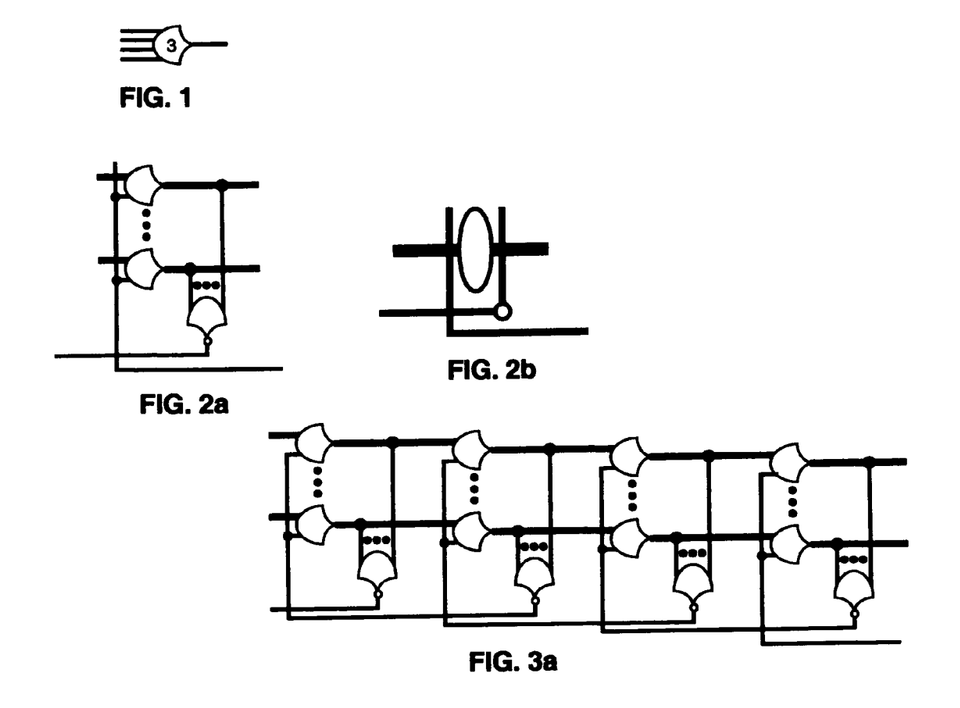
FIG. 1 illustrates a graphic symbol for a three-of-four gate according to an embodiment of the invention.
FIGS. 2a and 2b illustrate two graphic symbols for an asynchronous register according to an embodiment of the invention.
FIGS. 3a and 3b illustrate two graphic symbols for an asynchronous pipeline composed of asynchronous registers through which alternating data and NULL wavefronts spontaneously flow according to an embodiment of the invention.

Preferably, the threshold gates have a hysteresis characteristic in the switching rules. A gate output switches from NULL to asserted when the number of asserted inputs exceeds a threshold value. The gate output holds the asserted output until all inputs return to NULL. Thus, a gate can be characterized by the number of input signal lines and the value of the threshold. A gate having four inputs and a threshold of three will be said to be a "three-of-four" gate. FIG. 1 illustrates a graphic symbol for a three-of-four gate. The symbol of FIG. 1 corresponds to symbols used in U.S. patent application Ser. No. 08/711,232, and is included here to assist in relating the content of that application to descriptions of the present embodiments.

The embodiments described below preferably use asynchronous data registers as described in U.S. patent application Ser. No. 08/318,508, "Asynchronous Register for Null Convention Logic Systems," now U.S. Pat. No. 5,652,902 30 which is incorporated herein by reference in its entirety. An Asynchronous Register receives a set of inputs, stores their values, and passes those values on to a corresponding set of outputs. As used in the embodiments described below, asynchronous registers regulate timing of alternating wavefronts of NULL and meaningful data so that a set of signal lines cycle through the NULL state before assuming new meaningful values.

Figure 3B:
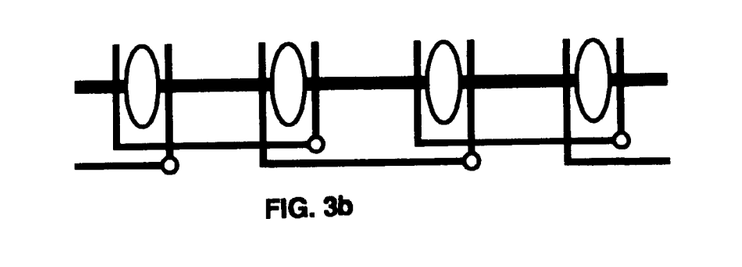

FIGS. 2a and 2b illustrates two graphic symbols for an asynchronous register. The symbols of FIG. 2a corresponds to symbols used in U.S. patent application Ser. No. 08/318, 508, now U.S. Pat. No. 5,652,902, and is included here to assist in relating the content of that application to descriptions here of the present embodiments. FIG. 2b is a different symbol for an asynchronous register, and represents the convention that will be used for the remainder of this description. The symbol is an oval across the data path with (1) a preceding line and (2) a following line attached to a dot. The oval represents data path storage elements. The preceding line represents an enable input which, when asserted, permits data to pass to the storage elements. The following line represents a "watcher" gate that monitors the output signal lines and generates an output completeness signal. The dot represents the inversion of the completeness signal which constitutes an acknowledge signal. As discussed more fully in U.S. patent application Ser. No. 08/318,508, now U.S. Pat. No. 5,652,902, the acknowledge signal line is NULL when all output signal lines are NULL, and is asserted when all variables of the output are asserted. As described above, a variable may be represented physically as a set of signal lines.) When asserted, the acknowledge signal can be used to indicate to a preceding circuit that the register is ready to receive a new NULL wavefront. When NULL, the acknowledge signal can be used to indicate to a preceding circuit that the register is ready to receive a new wavefront of meaningful data (i.e., a data wavefront). A preceding asynchronous register receives the acknowledge signal on its enable input from a following asynchronous register. It should be noted that no system clock is required to trigger the loading of data into a register. Instead, a register will load data as soon as (1) a downstream circuit is prepared to accept it, and (2) an upstream circuit has meaningful data available. FIGS. 3a and 3b illustrates two graphic symbols for an asynchronous pipeline composed of asynchronous registers through which alternating data and NULL wavefronts spontaneously flow.

2. Overview

Figure 4:
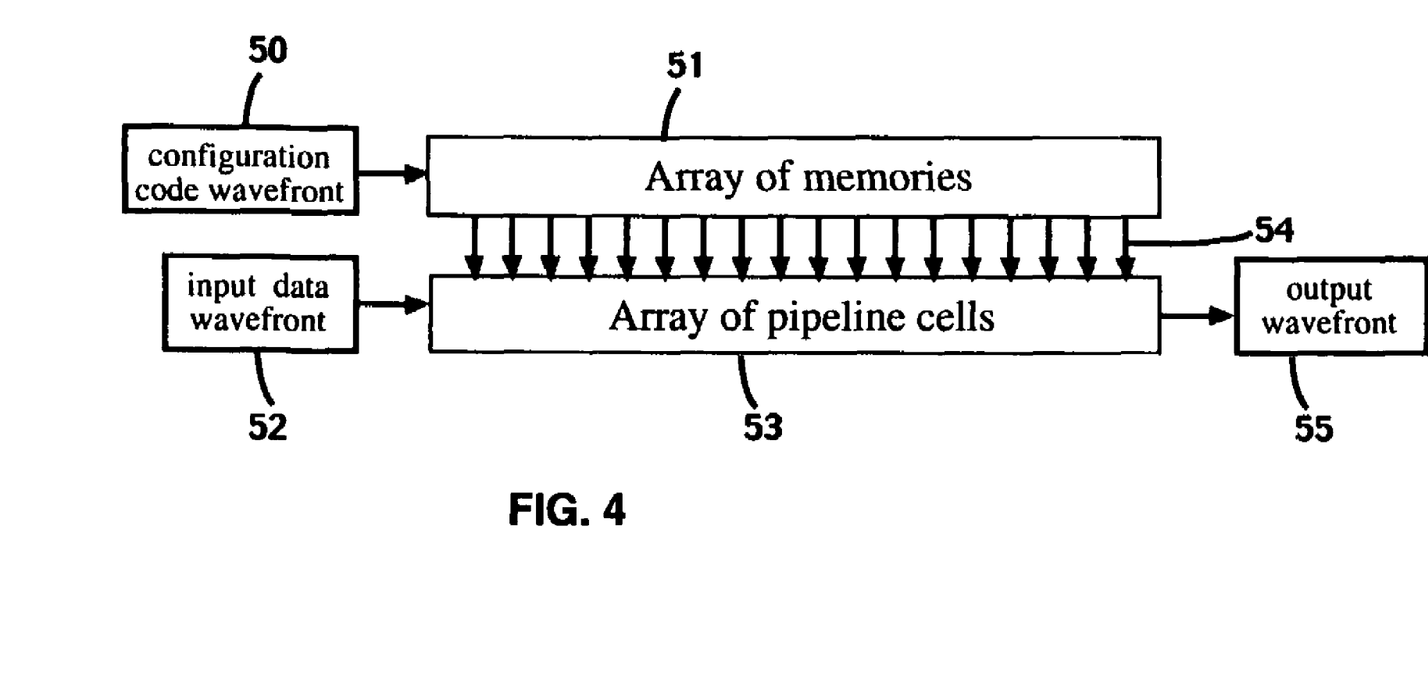
FIG. 4 illustrates a programmable pipeline array according to an embodiment of the invention.

A programmable pipeline array, illustrated in FIG. 4, receives a configuration code input 50, a data wavefront input 52 and produces a data wavefront output 55. The programmable pipeline array comprises a memory array plane 51 and a pipeline cell plane 53. The memory array plane and the pipeline cell plane are interconnected 54, as discussed more fully below in connection with FIG. 8.

3. Pipeline Cell Array

Figure 5:
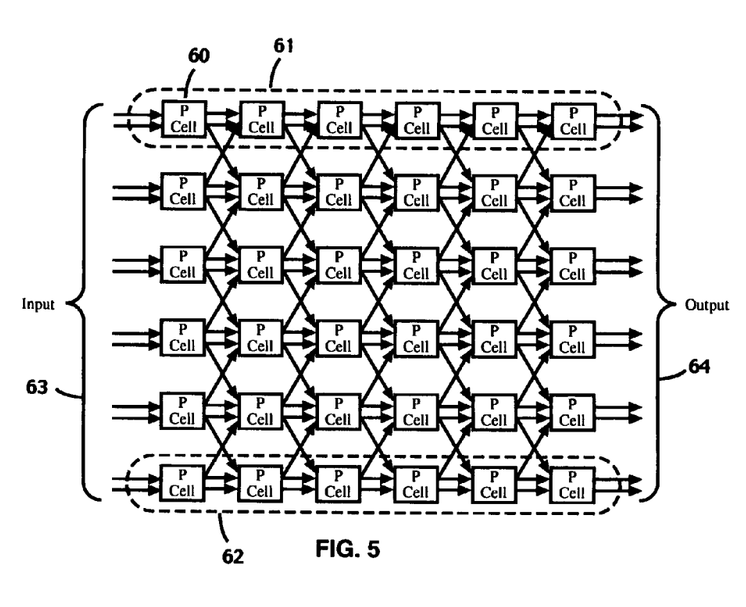
FIG. 5 illustrates an array of pipeline cells (P Cell) connected in an acyclic directed network according to an embodiment of the invention.

FIG. 5 illustrates an array of pipeline cells (P Cell) 60 connected in an acyclic directed network. The first rank of P Cells 63 forms the input of the array and the last rank of P Cells 64 forms the output of the array.

Figure 6:
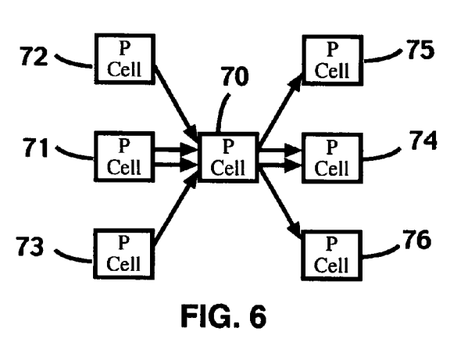
FIG. 6 illustrates the connectivity of each P Cell that is not an input or output P cell according to an embodiment of the invention.

FIG. 6 illustrates the connectivity of each P Cell that is not an input or output P Cell. Each internal P Cell 70 receives at least two inputs from its direct predecessor 71 and at least one input from each of two or more neighbors of its direct predecessor 72 and 73. Each P Cell presents at least two outputs to its direct successor 74 and at least one output to each of two or more neighbors of its direct predecessor 75 and 76. Examples of P cell connectivity is discussed in more detail below.

FIG. 5 illustrates a planar array with top and bottom rows each connected to a single neighbor. Top and bottom rows may be connected together to form a cylindrical topology. Other configurations of pipeline connections are possible. A more detailed description of an exemplary P cell is given below in connection with FIGS. 10-14.

4. Memory Array

Figures 7, 8:
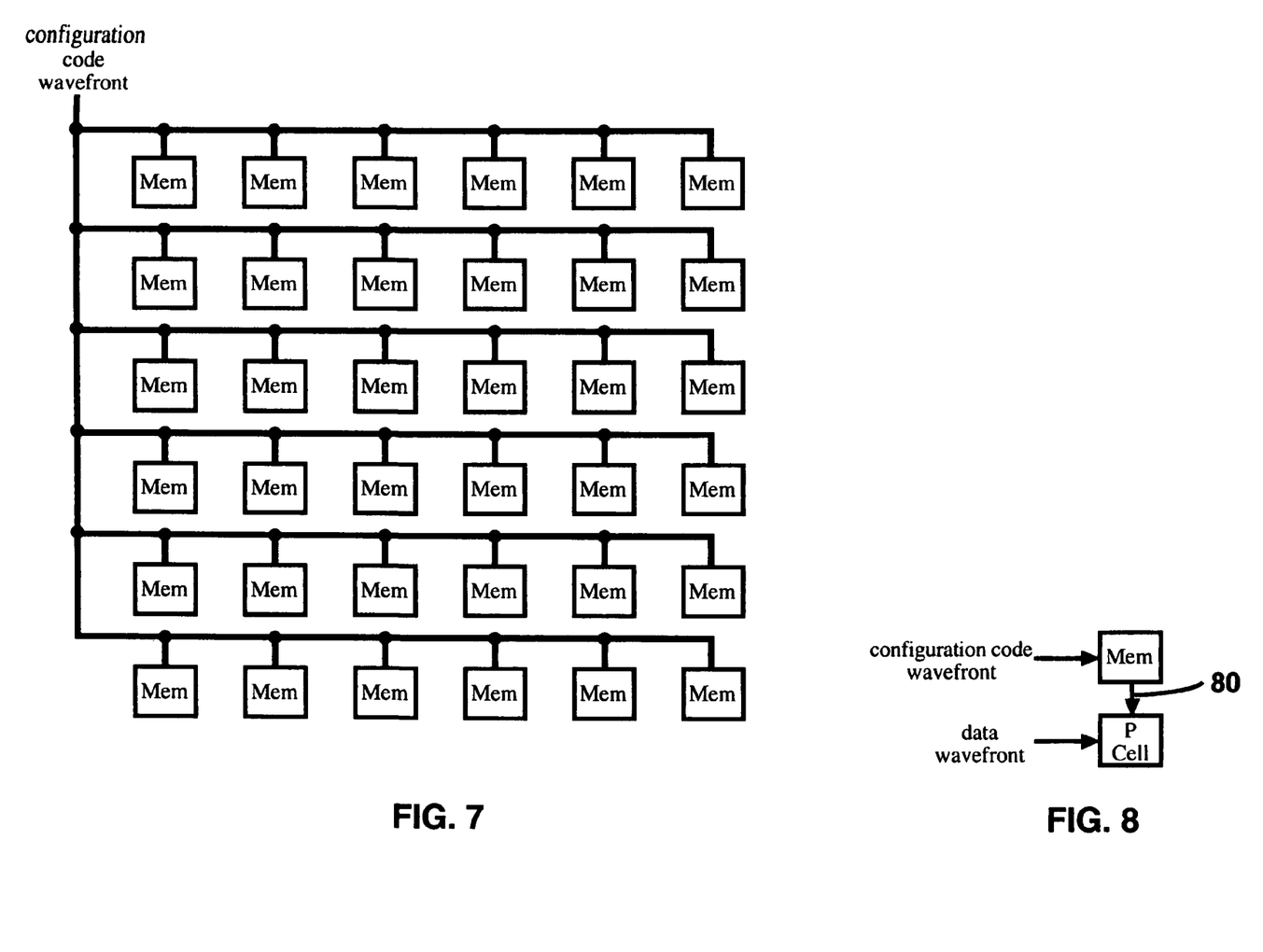
FIG. 7 illustrates a memory array with the configuration code connected to each memory as a read address according to an embodiment of the invention.
FIG. 8 illustrates the pipeline cell-memory pair according to an embodiment of the invention.

FIG. 7 illustrates a memory array with the configuration code connected to each memory as a read address. Examples of memory implementations can be found in Chapter 6 of Fant 2005.

5. The Pipeline Cell-Memory Pair

FIG. 8 illustrates the pipeline cell-memory pair. Each P Cell is associated with a memory which determines its configuration for each input wavefront. The configuration code wavefront is an address to the memory. The content of the address 80 is presented to the P Cell as its configuration control.

6. The Pipeline Structure

A sequential set of P Cells and their associated memories form a pipeline structure. The input and output paths, the paths between P Cells, the path of the input configuration code to each memory and the path from each memory to its associated P Cell are all referred to as pipeline paths.

7. The Memory Array Pipeline Structure

Figure 9:
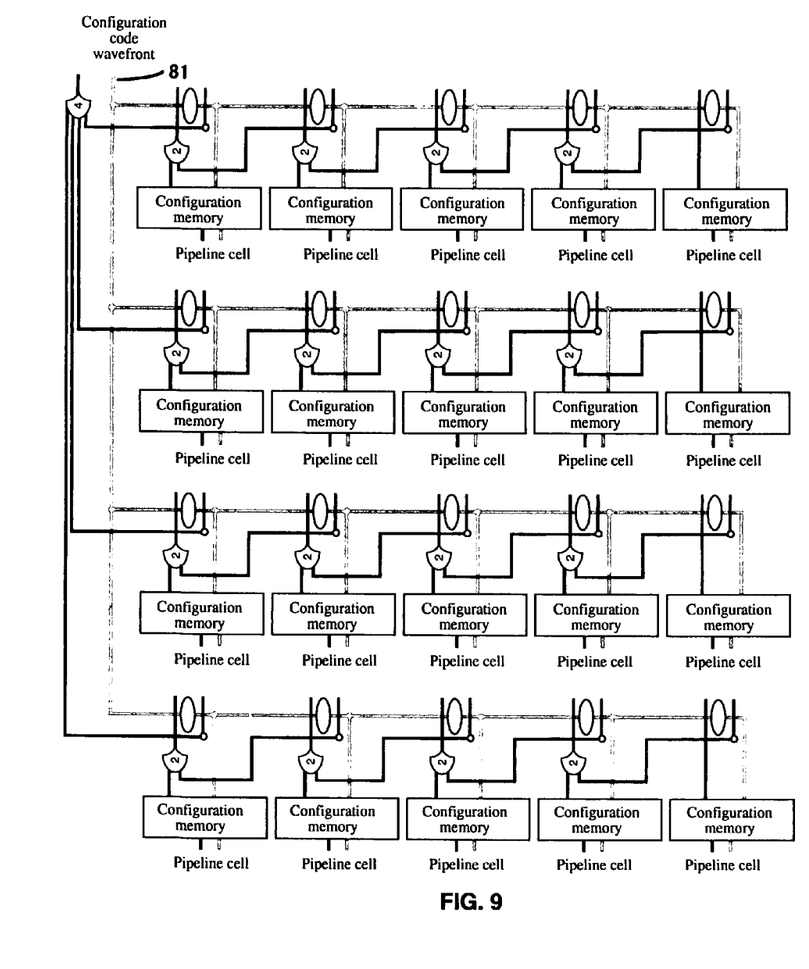
FIG. 9 illustrates a pipeline structure of a memory array according to an embodiment of the invention.

FIG. 9 illustrates a pipeline structure of a memory array. The configuration code input 81 of the pipeline corresponds to the configuration code input for the PPA 50 (FIG. 4). The configuration code input fans out to each memory, and each memory is a component of one stage of the pipeline. A configuration code wavefront is presented to the input, flows through the pipeline, and is presented to each memory as a read address. The content of the addressed memory location is presented to the associated P Cell as a configuration directive.

Configuration memories are distributed through the PPA with one memory associated with each P Cell. The configuration code is a common address to all the memories which collectively specify a single complete configuration of the PPA for processing a set of wavefronts. Each configuration of the PPA is expressed as a common address plane through the memories. The number of configurations simultaneously available depends on the size of the memories.

Writing a configuration into the memories is a non-performance critical operation and can be implemented in any convenient manner. The memories might be written with a serial data stream, they might be treated collectively as a single large random access memory or as banks of a partitioned memory.

8. The P Cell Pipeline Structure

The P Cell pipeline comprises three distinct stages: the fan-in steering structure stage, the function stage, and the fan-out steering structure stage as will be discussed in more detail below.

9. The Fan-In Steering Structure Stage

Figure 10:
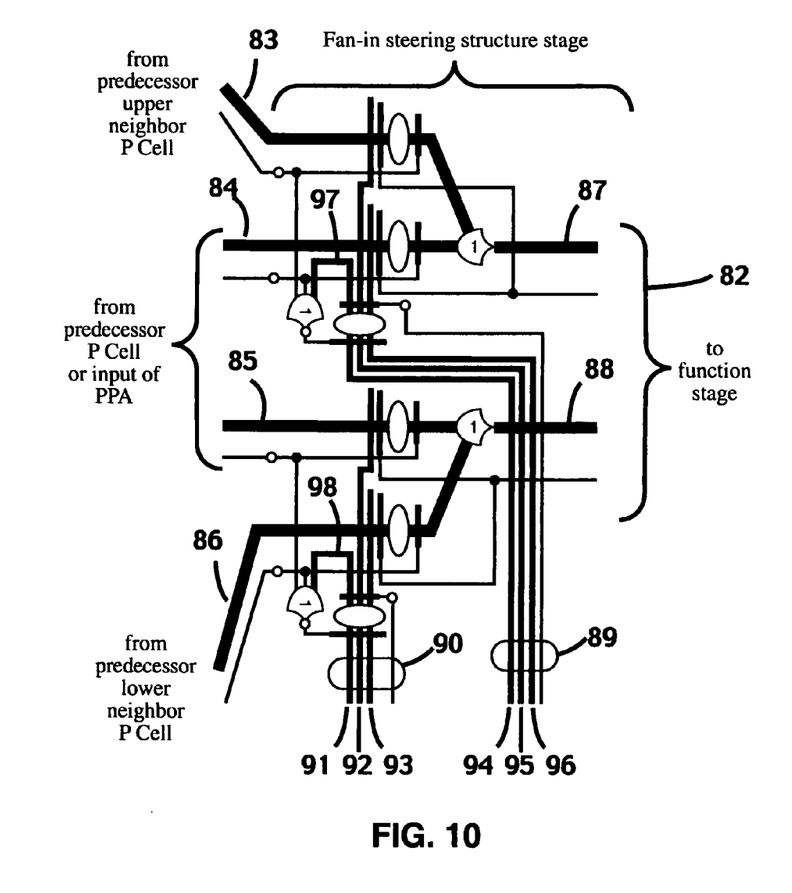
FIG. 10 illustrates the fan-in steering structure stage of a P Cell according to an embodiment of the invention.

FIG. 10 illustrates the fan-in steering structure stage of a P Cell. It receives one or more data path wavefronts from preceding P Cells or from the input of the PPA and directs it to the two inputs to the function stage 82. The steering is determined by two configuration directives read from the memory. From initialization, the Nth configuration code presented as an address to the memory will produce an Nth set of configuration directives to steer the Nth set of data path wavefronts presented to the P Cell.

A first configuration directive 89 (from a configuration memory) steers a wavefront from the predecessor upper neighbor 83 or a predecessor input 84 to function stage output 87. For example, a first configuration directive signal 96 may steer a wavefront from the predecessor upper neighbor input 83 to the function stage output 87. Another first configuration directive signal 95 may steer a wavefront from the predecessor input 84 to the function stage output 87. Yet another first configuration directive signal 94 effects a no-operation 97 when no input wavefront is present on either input 83, 84.

A second configuration directive 90 steers a wavefront from the predecessor lower neighbor 86 or a predecessor input 85 to function stage output 88. Another second configuration directive signal 93 steers a wavefront from the predecessor lower neighbor input 86 to the function stage output 88. Another second configuration directive signal 92 steers a wavefront from the predecessor input 85 to the function stage output 88. Yet another second configuration directive signal 91 effects a no operation 98 when no input wavefront is present on either input 85, 86.

10. The Function Stage

Figure 11:
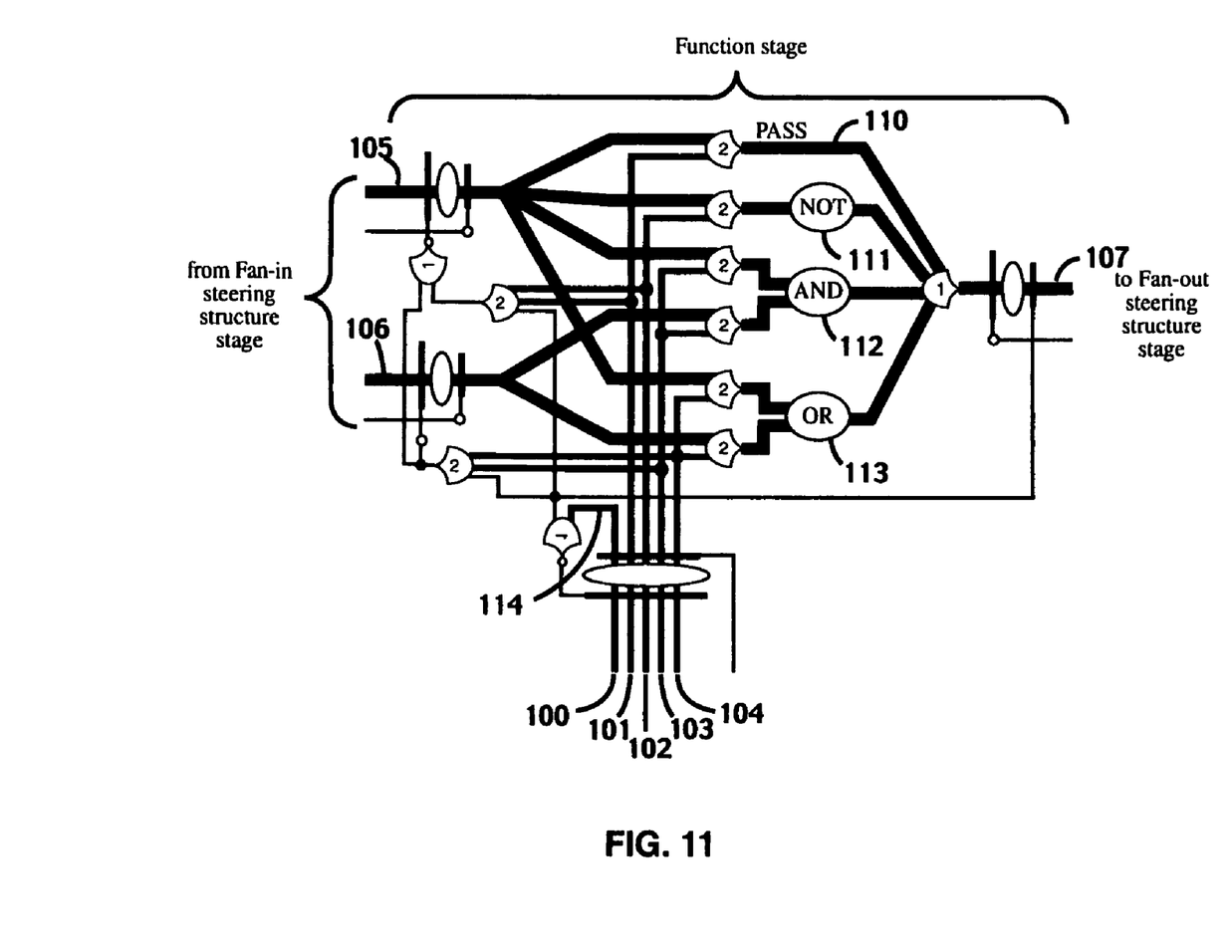
FIG. 11 illustrates a function stage of a P Cell according to an embodiment of the invention.

FIG. 11 illustrates a function stage of a P Cell. It receives one or two data path wavefronts from the fan-in steering structure stage 105, 106, applies a function on the wavefronts and outputs a result wavefront 82. The function is determined by a configuration directive read from the memory. From initialization, the Nth configuration code presented as an address to the memory will produce an Nth configuration directive determining the function applied to the Nth set of data path wavefronts presented to the function stage.

Figure 12:
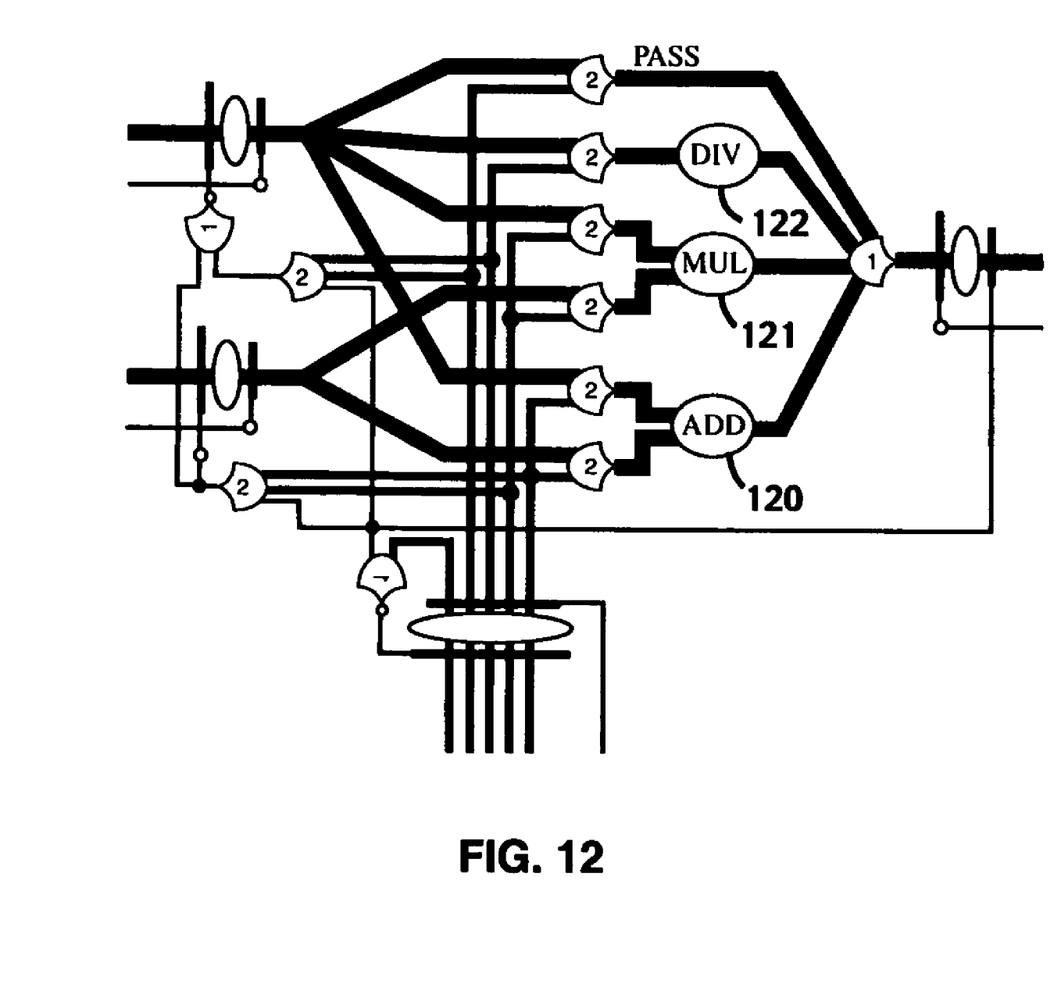
FIG. 12 illustrates that functions embodied by a function stage can be higher level functions on larger data wavefronts such as the arithmetic functions ADD, MULTIPLY and DIVIDE on integer or floating point numeric values.

By way of example a configuration directive 104 selects a Boolean OR function 113. Another configuration directive 103 selects an AND function 112. Another configuration directive 102 selects the NOT function 111. Another configuration directive 101 selects the PASS function 110 which passes an input wavefront without applying a function. A configuration directive 100 selects the no-operation function 114 when no wavefront is presented to either input 105, 106. Boolean functions have been shown for illustration purposes. Other functions may be implemented FIG. 12 illustrates that functions embodied by a function stage can be higher level functions on larger data wavefronts such as the arithmetic functions ADD 120, MULTIPLY 121 and DIVIDE 122 on integer or floating point numeric values.

11. The Fan-Out Steering Structure Stage

Figure 13:
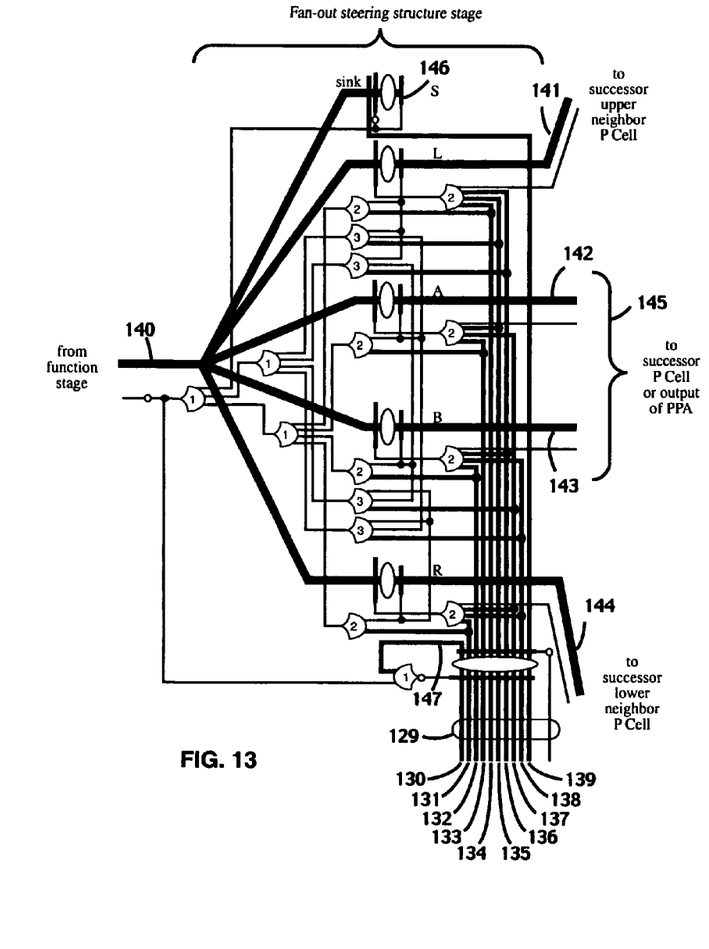
FIG. 13 illustrates a fan-out steering structure stage of a P Cell according to an embodiment of the invention.

FIG. 13 illustrates a fan-out steering structure stage of a P Cell. It receives the output of the function stage 140 as input and directs it to one or more outputs 141, 142, 143, 144 of the P Cell. A configuration directive 129 steers a wavefront to one or more of the successor upper neighbor output 141, to the successor lower neighbor output 144, or a successor output 142, 143. From initialization, the Nth configuration code presented as an address to the memory will produce an Nth configuration directive to steer the Nth data path wavefront presented to the fan-out steering structure stage.

A configuration directive signal 139 steers a wavefront from the function stage 140 to a sink stage 146, which sinks the wavefront and removes it from the pipeline. A configuration directive signal 138 steers a wavefront from the function stage 140 to the outputs 144, 143. A configuration directive signal 137 steers a wavefront from the function stage 140 to the outputs 144, 142. A configuration directive signal 136 steers a wavefront from the function stage 140 to the outputs 141, 143. A configuration directive signal 135 steers a wavefront from the function stage 140 to the outputs 142, 141. A configuration directive signal 134 steers a wavefront from the function stage 140 to the outputs 141. A configuration directive signal 133 steers a wavefront from the function stage 140 to the outputs 142. A configuration directive signal 132 steers a wavefront from the function stage 140 to the outputs 143. A configuration directive signal 131 steers a wavefront from the function stage 140 to the outputs 144. A configuration directive signal 130 effects no operation 147 when there is no wavefront presented from the function stage 140.

12. The Complete Pipeline Cell

Figure 14:
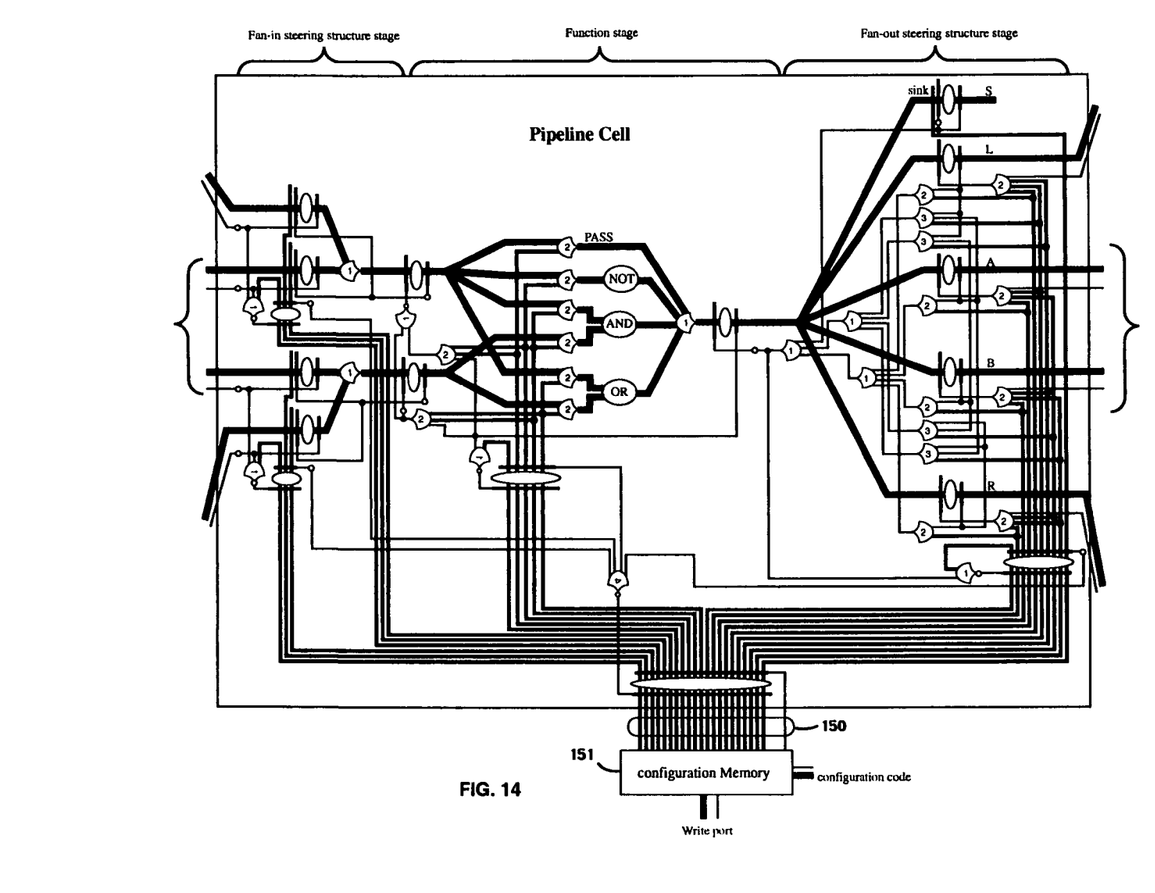
FIG. 14 shows a complete P Cell with the three stages assembled and the directives from each stage collected into a single memory storage unit and connected to the memory according to an embodiment of the invention.

FIG. 14 shows a complete P Cell with the three stages assembled and the directives from each stage collected into a single memory storage unit 150 and connected to the memory 151. From initialization, the Nth configuration code presented as an address to the memory will produce an Nth collected configuration directive to manage the propagation of the Nth set of data path wavefronts presented to P Cell.

13. PPA Behavior

The input to the PPA is set of data wavefronts and a configuration code presented together. For every Nth data wavefront set there is an Nth configuration code. The data wavefronts flow through the pipeline data paths of the P Cells. The configuration code flows along the pipeline paths to each memory, through the memory and as a directive to each P Cell. The wavefront flow is coordinated by the completeness behavior of each pipeline stage. At each P Cell in the PPA each Nth data wavefront arriving at a P Cell is associated with the Nth configuration directive arriving at that P Cell. For each Nth set of data wavefronts presented to the PPA, their propagation through the PPA is completely managed by the Nth configuration code presented at the input with the wavefronts As a presented data wavefront and its configuration code propagate through the first stages of the PPA followed by a NULL wavefront a next set of wavefronts can be presented and begin propagating through the PPA. There can be sets of data wavefronts simultaneously propagating through the PPA each being processed with a different configuration code.

14. Example Configuration

Figure 15:
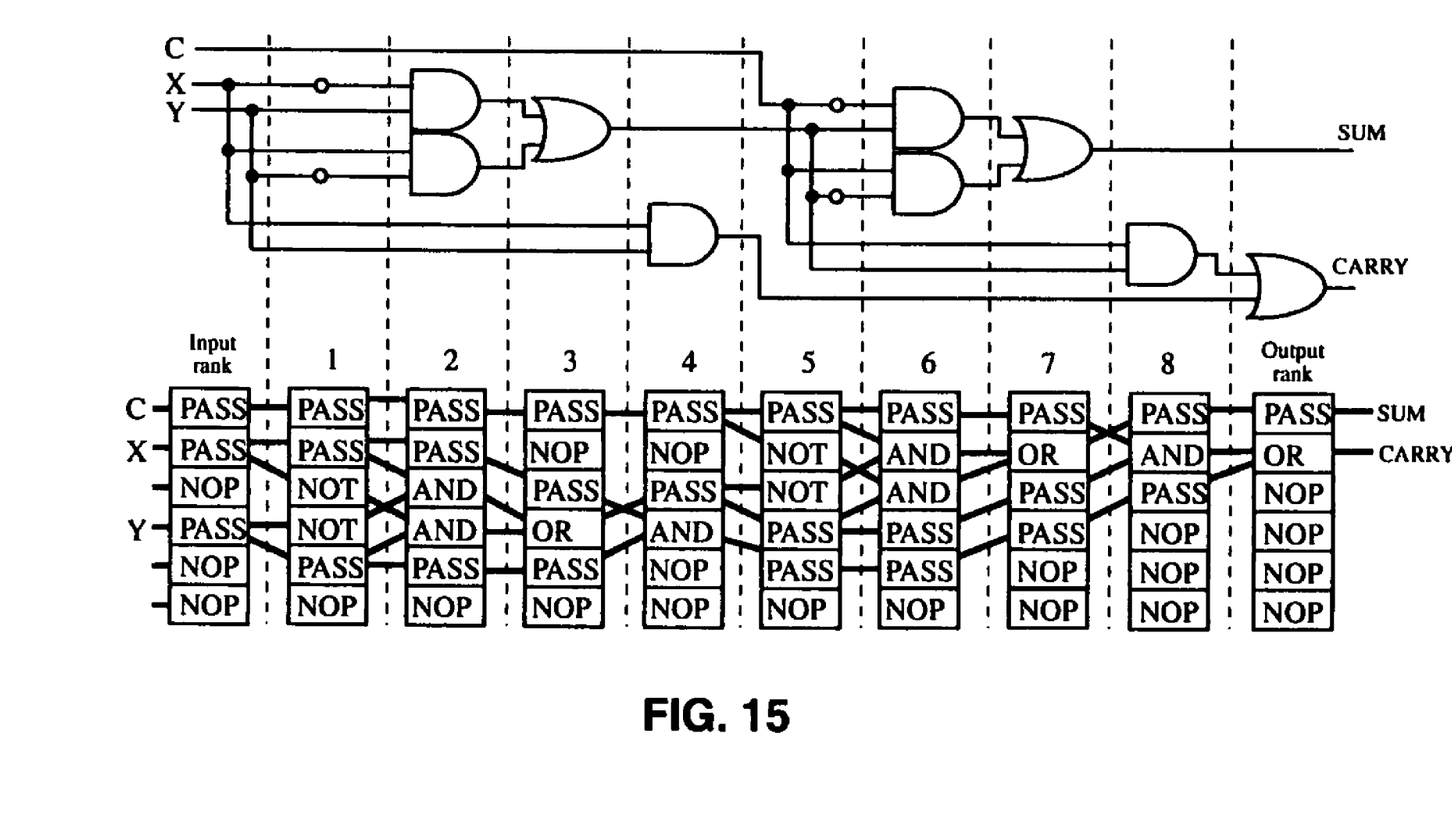
FIG. 15 illustrates an example configuration of a PPA according to an embodiment of the invention.

FIG. 15 illustrates an example configuration of a PPA. The example maps a Boolean full adder circuit composed of two half-adders and OR into a PPA. Each rectangle is a P Cell. The configuration of each P Cell is specified by the input connections, the output connections and the function specified inside the rectangle. The correspondence of the mapping is illustrated by drawing the Boolean circuit so that elements of the Boolean circuit implemented in each rank of the PPA is shown above that rank of the PPA.

The foregoing examples have been provided merely for the purpose of explanation and are in no way to be construed as limiting of the present invention. While the present invention has been described with reference to certain embodiments, it is understood that the words that have been used herein are words of description and illustration, rather than words of limitation. Changes may be made without departing from the scope and spirit of the present invention in its aspects. Although the present invention has been described herein with reference to particular means, materials and embodiments, the present invention is not intended to be limited to the particulars disclosed herein.

What is claimed is:

1. A data processing method comprising:
providing a first set of cells, the first set including (a) an input cell, (b) an output cell, and (c) a series of at least one interior cell providing an acyclic data processing path from the input cell to the output cell;
providing a second set of cells, the second set including (a) an input cell, (b) an output cell, and (c) a series of at least one interior cell providing an acyclic data processing path from the input cell to the output cell;
providing memory capable of presenting configuration instructions to a plurality of cells in response to a configuration code;
presenting first data to the input cells;
presenting a first configuration code to memory associated with the input cells;
advancing the first data in tandem through ranks of the sets of cells as first processed data; and
advancing the configuration code to memory associated with a rank of the sets of cells in tandem with the first processed data advancing to the rank;

wherein the interior cell of the first set of cells receives two signals from an upstream adjacent cell within the first set of cells and one signal from an upstream cell in the second set of cells; and wherein the interior cell of the second set of cells receives at least two signals from an upstream adjacent cell within the second set of cells and one signal from an upstream cell in the first set of cells.

2. The apparatus of claim 1, further comprising presenting to the series of at least one interior cell an instruction selecting a function of the series of at least one interior cell.

3. The apparatus of claim 1, further comprising:

presenting to a cell of the first set an instruction steering a data output of the cell of the first set to a cell of the second set; and presenting to a cell of the second set an instruction steering a data output of the cell of the second set to a cell of the first set.

4. The apparatus of claim 1, further comprising:

presenting to a cell of the first set an instruction selecting, as an input, data from a cell of the second set; and presenting to a cell of the second set an instruction selecting, as an input, data from a cell of the first set.

5. The method of claim 1 wherein a step of advancing the data in tandem through ranks of the sets of cells includes a step of steering data from a cell of one set to a cell of another set.

6. The method of claim 1 wherein a step of advancing the data in tandem through ranks of the sets of cells includes a step of selecting, as an input to a cell of a set, data from a cell of another set.

7. The method of claim 1 further including steps of:

presenting second data to the input cells;

presenting a second configuration code to memory associated with the input cells;

advancing the second data in tandem through ranks of the sets of cells as processed data; and advancing the second configuration code to memory associated with a rank of the sets of cells in tandem with the processed second data advancing to the rank.

8. The method of claim 1 wherein the first processed data has advanced to a first rank while the second processed data has advanced to a second rank.

9. The method of claim 1 further including a step of providing at least a third set of cells, the third set including (a) an input cell, (b) an output cell, and (c) a series of at least one interior cell providing an acyclic data processing path from the input cell to the output cell; wherein:

a data output of a cell, other than the output cell, of the third series connects to a data input of a cell of the second series; and a data output of a cell, other than the output cell, of the second series connects to a data input of a cell of the second series.

10. The apparatus of claim 1, wherein said advancing comprises unidirectionally advancing.

* * * * *